United States Patent [19]

Bauch et al.

[11] Patent Number: 4,639,613
[45] Date of Patent: Jan. 27, 1987

[54] BROAD BAND COUPLING SWITCH ARRANGEMENT WITH GATED POWER SUPPLY

[75] Inventors: Helmut Bauch, Starnberg; Hans Rehm, Munich, both of Fed. Rep. of Germany

[73] Assignee: Siemens Aktiengesellschaft, Berlin and Munich, Fed. Rep. of Germany

[21] Appl. No.: 802,625

[22] Filed: Nov. 29, 1985

Related U.S. Application Data

[63] Continuation of Ser. No. 173,658, Jul. 29, 1985, abandoned.

[30] Foreign Application Priority Data

Aug. 10, 1979 [DE] Fed. Rep. of Germany ....... 2932588

[51] Int. Cl.⁴ .................. H03K 17/56; H03K 19/086; H03K 3/01
[52] U.S. Cl. .................................... 307/241; 307/253; 307/467; 307/296 A
[58] Field of Search ............... 307/241, 351, 243, 239, 307/252, 253, 467, 296, 445, 296 A

[56] References Cited

U.S. PATENT DOCUMENTS

| | | | |
|---|---|---|---|
| 2,712,065 | 6/1955 | Elbourn et al. | 307/445 |
| 3,092,732 | 6/1963 | Milford | 307/241 |
| 3,166,679 | 1/1965 | Paufve | 307/241 |
| 3,181,008 | 4/1965 | Huckins | 307/351 |

*Primary Examiner*—Stanley D. Miller
*Assistant Examiner*—B. P. Davis
*Attorney, Agent, or Firm*—Hill, Van Santen, Steadman & Simpson

[57] ABSTRACT

The disclosure relates to a broad band coupling arrangement with coupling point switches in ECL technology, whereby a plurality of coupling point switches are formed by a corresponding plurality of linkage elements which are integrated on one chip. In order to reduce the power comsumption, a switching transistor is inserted in the operating voltage supply of each chip, said switching transistor only being conductive when at least one linkage element of the appertaining chip is selected. The disclosure can particularly be employed in the distribution of video signals.

8 Claims, 1 Drawing Figure

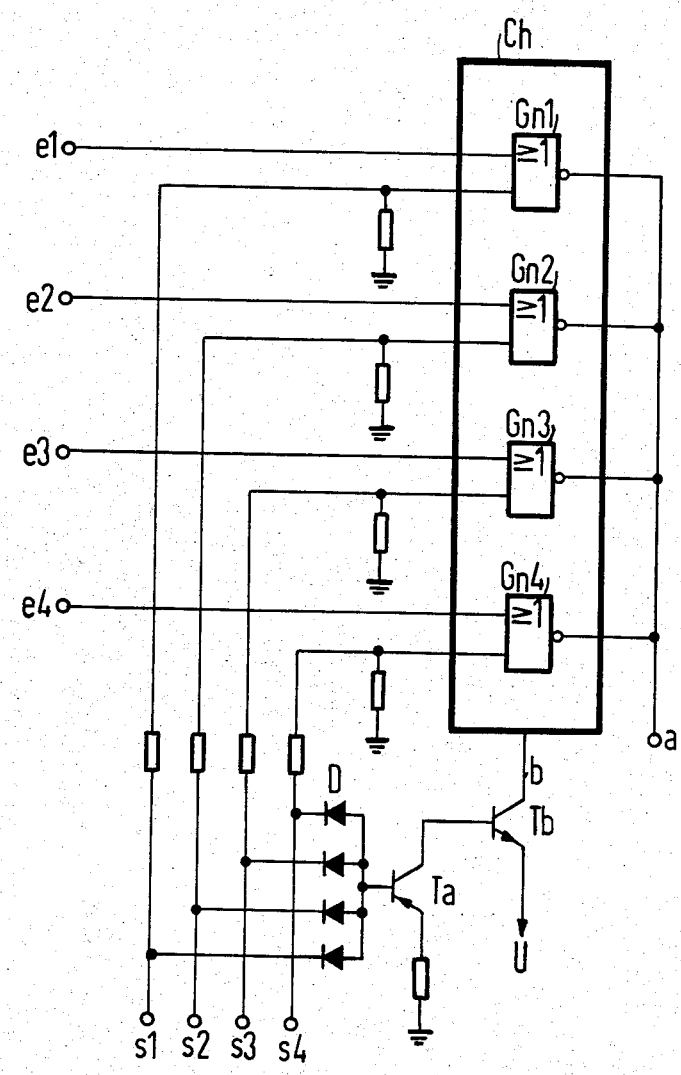

BROAD BAND COUPLING SWITCH ARRANGEMENT WITH GATED POWER SUPPLY

This is a continuation of application Ser. No. 173,658 filed July 29, 1985.

BACKGROUND OF THE INVENTION

The invention relates to a coupling arrangement for selective through-connection of signals of high band width and which, in particular, can be employed in the distribution of video signals.

In such a broad band coupling arrangement, the coupling point circuits, whose function is to selectively connect input lines to output lines of the coupling arrangement, can be formed by means of logic linkage elements realized in ECL (emitter coupled logic) technology in view of switching times which are as small as possible or, respectively, in view of the preferably frequency-, pulsphase- or pulsecode-modulated signals to be through-connected with signal frequencies of, for example, up to more than 80 MHz (cf. Pfannschmidt: "Arbeitsgeschwindigkeitsgrenzen von Koppelnetzwerken für Breitband-Digitalsignale", Dissertation Technical University, Braunschweig, 1978; and German AS No. 28 28 662). Independent of their respective switching state, however, such commercially available linkage elements cause dissipations, so that larger coupling fields exhibit a relatively high, largely useless power consumption (cf., also, Harthmuth, Duck, Jenik: "Aufbau und Anwendung integrierter Halbleiterschaltungen", Regelungstechnik 16 (1968) 12, 541 ... 588, and 17 (1969) 1, 12 ... 18; section 3c).

SUMMARY OF THE INVENTION

The object of the invention is to avoid such an unnecessary power consumption. The invention relates to a broad band coupling arrangement with coupling point circuits in ECL technology in which a plurality of coupling point switches are respectively realized by means of a corresponding plurality of linkage elements combined on a chip module; this coupling arrangement is inventively characterized in that a switching transistor is inserted in the operating voltage supply line of each such chip module, said switching transistor being conductive only when at least one linkage element of the appertaining chip module is driven.

In addition to the advantages of a considerable power reduction and, thus, lower operating costs as well as lower demands made of the power supply devices, the invention is accompanied by a series of further advantages: Thus, the low dissipation heat allows a compact format, whereby cooling measures can be completely omitted or at least significantly reduced; in the case of a monolithic integrated circuit construction, under certain conditions, a correspondingly large number of components can be combined on one module (chip). In a large coupling arrangement, in which the number of the coupling point switches respectively through-connected is small in comparison to the overall number of coupling point switches, the coupling point switches have a correspondingly low mean operating time and, thus, a correspondingly long service life or, respectively, a correspondingly reduced failure rate; since the currentless coupling point circuits respectively situated in the blocking state effect no signal amplification, a greater cross-talk attenuation is achieved in the coupling arrangement at the same time and lower noise is obtained.

In a further development of the invention, the selection inputs of the individual linkage elements of the chip module can be connected to the control input of the switching transistor via an OR element; this has the advantage that the switching of a coupling point switch as well as the through-connection of the power supply of the appertaining chip module can be respectively effected by means of one and the same control signal.

The invention will be described in yet greater detail on the basis of the accompanying drawing sheet; and other objects, features and advantages will be apparent from this detailed disclosure and from the appended claims.

BRIEF DESCRIPTION OF THE DRAWING

The single FIGURE is an electric circuit diagram showing a broad band coupling arrangement in accordance with the invention.

DETAILED DESCRIPTION

The drawing illustrates a broad band coupling arrangement with a plurality of input lines e1 ... e4 and one output line a, whereby coupling point switches which may be formed by means of linkage or logic or switching elements, for example NOR elements Gn1 ... Gn4 combined on a chip module Ch lie at the points of intersection of the input lines with the output line. Thereby, each linkage element is connected with its one input to the respective appertaining input line e and with its output to the appending output line a; with its respectively other input, each linkage element Gn1 ... Gn4 is connected with a selection line s1 ... s4 individually allocated to it, via which the coupling point switch formed by the respective linkage element can be driven into the conductive state or can again be blocked—for TTL-ECL (transistor logic to emitter coupled logic) level adaptation via a voltage divider.

Let it be pointed out here that the coupling arrangement need not be limited to the plurality of input or, respectively, output lines e, a illustrated in the drawing and/or to the illustrated module with one column of coupling point switches, but, on the contrary, can also exhibit further input lines and/or further output lines, whereby one coupling point switch in the form of a linkage element lies at each point of intersection between an input line and an output line, and whereby such linkage elements can also be combined with further linkage elements on further chip modules.

In such a broad band coupling arrangement, of course, only a relatively low number of coupling point switched is situated in the conductive state at any moment and, in order to keep the nonselected coupling point switches, i.e., those coupling point switches not situated in the conductive state, as free of dissipation as possible, the switching transistor Tb (implemented, for example, by a transistor BC257) which is conductive only upon selection of at least one linkage element Gn of the appertaining chip module Ch is inserted in the operating voltage supply b of such chip module Ch (realized, for example, as a Motorola Chip MC 10102), as can be seen from the drawing. An OR element D whose inputs lie at the selection lines s1 ... s4 of the coupling arrangement leads to the control input of the switching transistor Tb via a transistor Ta inserted for inverting the selection signals. These selection lines s1 ... s4, moreover, can be connected to the individual outputs of a selection decoder allocated to the coupling arrangement, without this being illustrated in detail in the drawing.

If none of the coupling point switches Gn combined on a chip module Ch is driven proceeding from its selection line s, then the supply of operating voltage U of, for example, −5 V to the appertaining chip module Ch is at the same time interrupted by the switching transistor Tb then situated in the blocking condition; all coupling point switches are then currentless and, thus, free of dissipation.

If one of the coupling point switches Gn1 . . . Gn4 is to be driven into the conductive condition for the connection of the appertaining input line e1 . . . e4 with the output line a, and, therefore, a corresponding selection signal occurs on the appertaining selection lines s1 . . . s4, then this selection signal first effects a changeover of the switch Tb into the conductive condition via the OR element D and the transistor Ta, so that the operating voltage U is now supplied to the chip module Ch; thus, the appertaining coupling point switch Gn1 . . . Gn4 on the chip module arrives in the conductive condition, whereas the nonselected coupling point switches of the chip module assume the blocking condition.

If the connection is again released by removing the selection signal from the appertaining selection input s and if no other coupling point switch of the chip module Ch is in the conductive state, then the switching transistor Tb again arrives in the blocking condition, so that the operating voltage supply to the chip module Ch is again interrupted and this chip module is again free of dissipation. The same also applies to further chip modules (not illustrated in the drawing in detail) of the coupling arrangement in which, thus, only those chip modules which contain a coupling point switch now situated in the conductive condition are respectively subject to dissipation.

It will be apparent that many modifications and variations may be effected without departing from the scope of the novel concepts and teachings of the present invention.

We claim as our invention:

1. A broad band coupling arrangement comprising a broad band switching network with coupling point switches, said network having a chip module providing logic elements in ECL technology for forming a plurality of said coupling point switches, and operating voltage supply means for said logic elements of said chip module, a switching transistor is inserted in said operating voltage supply means of each said chip module, said operating voltage supply means comprising a common operating voltage supply for said chip module shared by all of said logic elements of said chip module, and said swithing transistor being conductive for enabling said switching network only in response to a logic signal condition for at least one of said logic elements of the said chip module, said switching network using less energy when it is disabled than when it is enabled.

2. A broad band coupling arrangement according to claim 1, wherein said logic elements of said chip module have respective selection inputs, and OR logic means having respective inputs connected with said selection input and having an output connected to a control input of said switching transistor for rendering said switching transistor conductive upon activation of at least one of said selection inputs.

3. A broad band coupling arrangement according to claim 2, wherein said selection inputs are respectively connected to individual outputs of a selection decoder allocated to said coupling arrangement.

4. A broad band coupling arrangement comprising:
a broad band switching network of coupling point switches, said switching network including at least one chip module having logic elements formed in ECL technology;
a means for supplying an operating voltage to said at least one chip module, said operating voltage supply being common to said logic elements on said chip module;
a switching transistor connected between said operating voltage supply means and said at least one chip module, said switching transistor being switchable between an enabled conductive state and a disabled nonconductive state;
means for enabling said switching transistor in response to a logic signal condition, said logic signal condition corresponding to a selection of at least one of said logic elements; and
said switching network using less energy when said switching transistor is disabled then when said switching transistor is enabled.

5. A broad band coupling arrangement as claimed in claim 4, wherein said logic elements of said at least one chip module have selection inputs and wherein said enabling means includes at least one OR logic element having inputs connected to said selection inputs and having an output connected to a control input of said switching transistor for enabling said switching transistor to a conductive state upon activation of at least one of said selection intputs.

6. A broad band coupling arrangement as claimed in claim 5, wherein said at least one OR logic element includes a plurality of rectifiers connected to respective ones of said selection inputs, and a second transistor having a base lead connected to said plurality of rectifiers and a second lead connected to said control input of said switching transistor.

7. A broad band coupling arrangement as claimed in claim 5, further comprising:
a selection decoder having individual outputs connected said selection inputs.

8. An improved broad band coupling arrangement having ECL coupling point switches, said coupling point switches being logic elements, a plurality of said logic elements being combined on a chip module, operating voltage supply connectable for supply power to said chip module, each of said coupling point switches having a selection input and a signal input and a signal output, said coupling point switches being through-switchable in selective fashion by activation of said selection input, the improvement comprising:
a switching transistor connected in said operating voltage supply of said chip module for selective conduction of power thereto, said switching transistor being conductive only upon activation of the selection input of at least one of said logic elements of said chip module.

* * * * *